(12) United States Patent
Liu (10) Patent No.: US 7,638,357 B2
(45) Date of Patent: Dec. 29, 2009

(54) PROGRAMMABLE RESISTANCE MEMORY DEVICES AND SYSTEMS USING THE SAME AND METHODS OF FORMING THE SAME

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 11/509,713

(22) Filed: Aug. 25, 2006

(65) Prior Publication Data

US 2008/0073638 A1  Mar. 27, 2008

(51) Int. Cl.
*H01L 21/00* (2006.01)
*H01L 21/06* (2006.01)
*H01L 29/76* (2006.01)
*H01L 27/108* (2006.01)
*H01L 29/94* (2006.01)

(52) U.S. Cl. .................. 438/84; 438/95; 438/102; 438/93; 257/214; 257/298

(58) Field of Classification Search ............. 438/382, 438/95, 84, 102; 977/734; 257/214, 298
See application file for complete search history.

(56) References Cited

U.S. PATENT DOCUMENTS

| | | | |
|---|---|---|---|
| 5,920,788 A * | 7/1999 | Reinberg | 438/466 |
| 6,815,266 B2 * | 11/2004 | Rodgers et al. | 438/133 |
| 7,018,863 B2 * | 3/2006 | Moore et al. | 438/95 |
| 7,417,245 B2 * | 8/2008 | Happ et al. | 257/2 |
| 2004/0026686 A1 | 2/2004 | Lung | |
| 2004/0208038 A1 | 10/2004 | Idehara | |
| 2006/0110878 A1 | 5/2006 | Lung et al. | |
| 2006/0175599 A1 * | 8/2006 | Happ | 257/4 |
| 2007/0152205 A1 | 7/2007 | Chen | |
| 2007/0176261 A1 | 8/2007 | Lung | |
| 2008/0014733 A1 | 1/2008 | Liu | |

FOREIGN PATENT DOCUMENTS

WO  WO 2007/126690  11/2007

OTHER PUBLICATIONS

International Search Report w/Written Opinion, Feb. 29, 2008.

* cited by examiner

*Primary Examiner*—Chuong A. Luu
(74) *Attorney, Agent, or Firm*—Dickstein Shapiro LLP (57) ABSTRACT

A programmable resistance memory element and method of forming the same. The memory element includes a first electrode, a dielectric layer over the first electrode and a second electrode over the dielectric layer. The dielectric layer and the second electrode each have sidewalls. A layer of programmable resistance material, e.g., a phase change material, is in contact with the first electrode and at least a portion of the sidewalls of the dielectric layer and the second electrode. Memory devices including memory elements and systems incorporating such memory devices are also disclosed.

18 Claims, 10 Drawing Sheets

PROGRAMMABLE RESISTANCE MEMORY DEVICES AND SYSTEMS USING THE SAME AND METHODS OF FORMING THE SAME

FIELD OF THE INVENTION

Embodiments of the invention relate to semiconductor devices and, in particular, to programmable resistance memory elements and methods of forming and using the same.

BACKGROUND OF THE INVENTION

Non-volatile memories are useful storage devices due to their ability to maintain data absent a power supply. Materials have been investigated for use in non-volatile memory cells. One class of programmable resistance materials are phase change materials, such as chalcogenide alloys, which are capable of stably transitioning between amorphous and crystalline phases. Each phase exhibits a particular resistance state and the resistance states distinguish the logic values of a memory element formed with such materials. Specifically, an amorphous state exhibits a relatively high resistance, and a crystalline state exhibits a relatively low resistance.

Figure 1A:
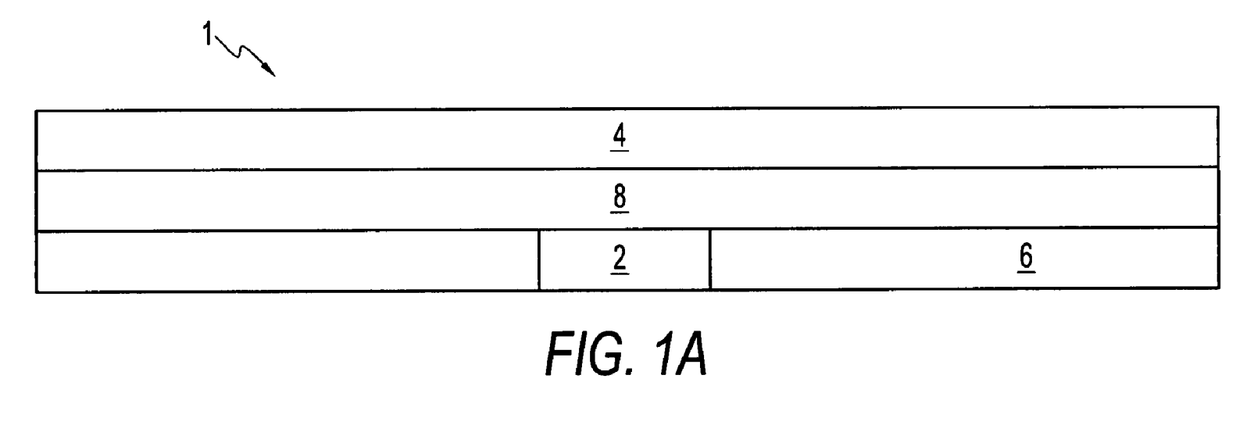
FIGS. 1A and 1B illustrate a conventional phase change memory element.
Figure 1B:
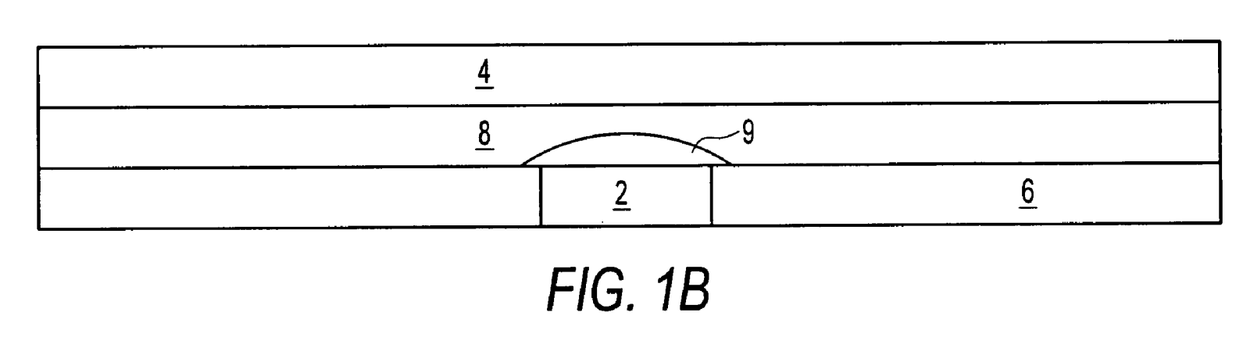

A conventional phase change memory element 1, illustrated in FIGS. 1A and 1B, often has a layer of phase change material 8 between first and second electrodes 2, 4. The first electrode is within a dielectric material 6. The phase change material 8 is set to a particular resistance state according to the amount of current applied between the first and second electrodes 2, 4. To obtain an amorphous state (FIG. 1B), a relatively high write current pulse (a reset pulse) is applied through the phase change memory element 1 to melt at least a portion 9 of the phase change material 8 covering the first electrode 2 for a first period of time. The current is removed and the phase change material 8 cools rapidly to a temperature below the crystallization temperature, which results in the portion 9 of the phase change material 8 covering the first electrode 2 having the amorphous state. To obtain a crystalline state (FIG. 1A), a lower current write pulse (a set pulse) is applied to the phase change memory element 1 for a second period of time (typically longer in duration than the first period of time and crystallization time of amorphous phase change material) to heat the amorphous portion 9 of the phase change material 8 to a temperature below its melting point, but above its crystallization temperature. This causes the amorphous portion 9 of the phase change material 8 to re-crystallize to the crystalline state that is maintained once the current is removed and the phase change memory element 1 is cooled. The phase change memory element 1 is read by applying a read voltage, which does not change the phase state of the phase change material 8.

One drawback of conventional phase change memory is the large programming current needed to achieve the phase change. This requirement leads to large access transistor design to achieve adequate current drive. Another problem associated with the memory element 1, is poor reliability due to uncontrollable mixing of amorphous and polycrystalline states at the edges of the programmable volume (i.e., portion 9). Accordingly, it is desirable to have phase change memory devices with reduced programming current requirements and increased reliability.

DETAILED DESCRIPTION OF THE INVENTION

In the following detailed description, reference is made to various embodiments of the invention. These embodiments are described with sufficient detail to enable those skilled in the art to practice them. It is to be understood that other embodiments may be employed, and that various structural, logical and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Figure 2A:
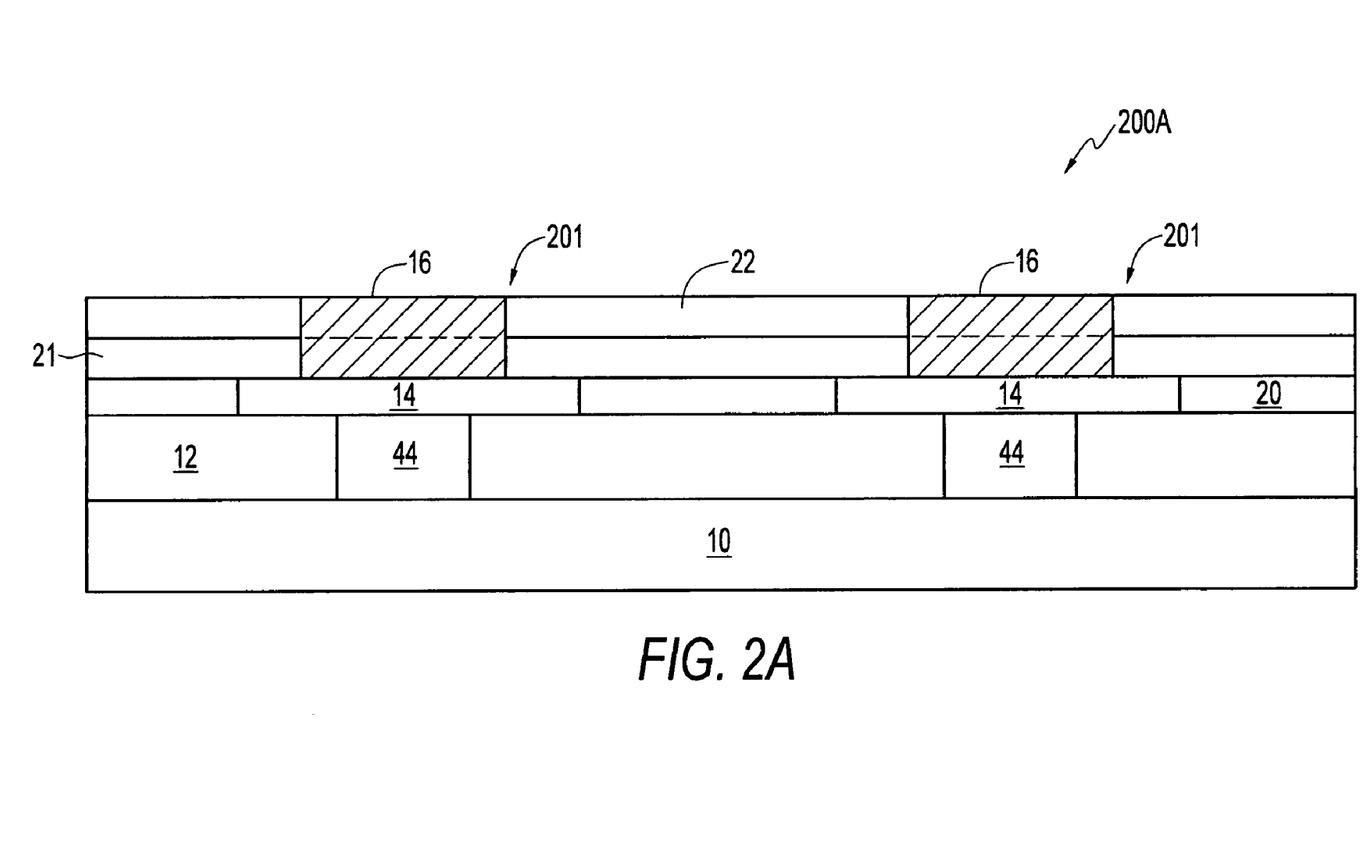
FIG. 2A illustrates partial cross-sectional view of a phase change memory device according to an embodiment of the invention.
Figure 2B:
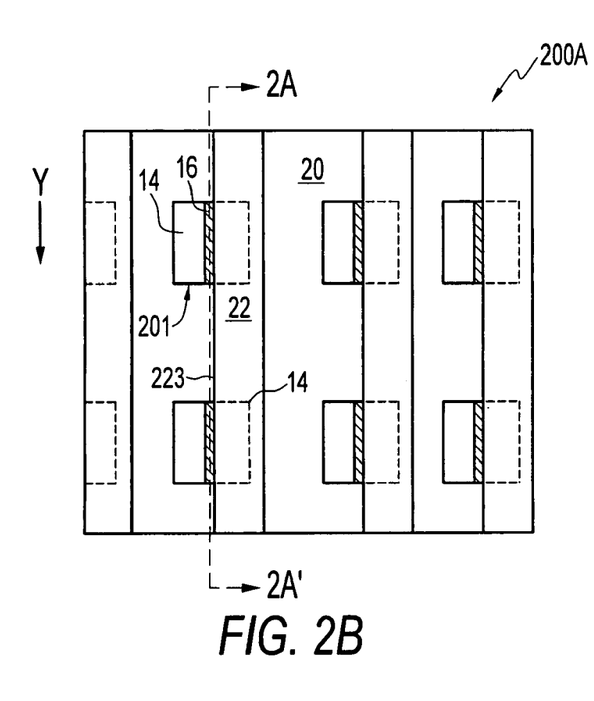
FIG. 2B illustrates a top-down view of the phase change memory device of FIG. 2A.

Embodiments of the invention are now explained with reference to the figures, in which like reference numbers indicate like features. FIGS. 2A-2B illustrate a portion of a phase change memory device 200A constructed in accordance with a first embodiment of the invention. FIG. 2B is a top-down view of a portion of the phase change memory device 200A. FIG. 2A is a cross-sectional view of the device 200A along the line 2A-2A' shown in FIG. 2B.

The memory device 200A includes memory elements 201, each for storing at least one bit, i.e., logic 1 or 0. The memory elements 201 are supported by a substrate 10. A first dielectric layer 12 is formed on the substrate 10, and conductive plugs 44 are formed within the first dielectric layer 12. First electrodes 14 are formed within a second dielectric layer 20. Each first electrode 14 is formed over and in contact with a conductive plug 44.

A third dielectric layer 21 is provided over the first electrodes 14 and second dielectric layer 20. Second electrodes 22 are provided over the third dielectric layers 21. The third dielectric layers 21 and second electrodes 22 are formed as lines in the Y direction (FIG. 2B).

Programmable resistance material layers, depicted as phase change material layers 16 are on sidewalls of second electrode 22 lines and third dielectric layer 21 lines and in contact with respective first electrodes 14. The phase change material layers 16 may be any suitable material. Examples of suitable phase change materials are provided below in connection with the description of FIG. 3D. From a top-down perspective, the third dielectric layers 21 and second electrodes 22 are laterally offset from the first electrodes 14 to provide a location for the phase change material layers 16 to contact the first electrodes 14. The memory elements 201 correspond to where a first electrode 14 and second electrode 22 and a portion of a phase change material layer 16 intersect electrically. In FIGS. 2A-2B, the phase change material layers 16 are shown only on portions of the second electrode 22 line and third dielectric layer 21 line sidewalls that are directly over a first electrode 14. In such a case, the entirety of each phase change layer 16 in a memory element 201 serves as the programmable volume of that memory element 201 and can be thoroughly phase changed during operation of the device 200A. Alternatively, the phase change material layers 16 can fully cover sidewalls of the second electrode 22 lines and third dielectric layer 21 lines.

As shown in FIG. 2B, from a top-down perspective, the first electrodes 14 are arranged in columns along the Y direction. The second electrode 22 lines are formed over adjacent first electrodes 14 such that a lateral edge 223 of the second electrodes 22 are directly over a portion of the first electrodes 14. Each second electrode 22 line is associated with a single column of first electrodes 14. Accordingly, as shown in FIG. 2B, the phase change material layers 16 are along portions of only one lateral edge 223 of the second electrodes 22.

Since the phase change material layer 16 for each memory element 201 is formed only on a sidewall of a second electrode 22, the contact area of the phase change material layer 16 to the electrodes 14, 22 for each memory element 201 is minimized. The programming volume of the memory elements 201 and the voltage needed to achieve the phase change for the memory elements 201 is also minimized as compared to that required for a conventional phase change memory element 1 (FIG. 1A). Further, the programming volume can be limited to a fixed volume that is thoroughly phase changed during each programming operation to promote reliability.

Additional dielectric layers, contact and metal lines can also be included in the device 200A. For example, contacts to first and second electrodes 14, 22 and metal lines can be included.

Figure 2C:
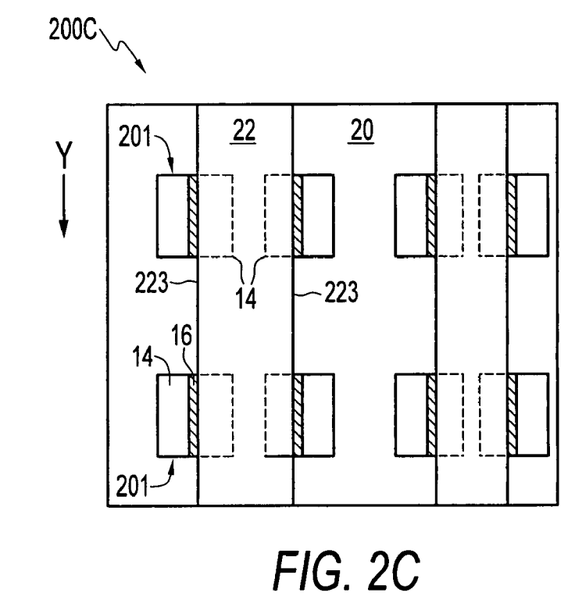
FIGS. 2C-2E illustrates top-down views of phase change memory devices according to other embodiments of the invention.

FIG. 2C illustrates a top down perspective of a memory device 200C according to another embodiment. The memory device 200C of FIG. 2C is similar to that shown in FIGS. 2A-2B, except that each second electrode 22 line is associated with two columns of first electrodes 14. That is, each second electrode 22 overlies portions of first electrodes 14 in two columns. Accordingly, as shown in FIG. 2C, the phase change material layers 16 are along portions of both lateral edge 223 of the second electrodes 22.

Figure 2D:
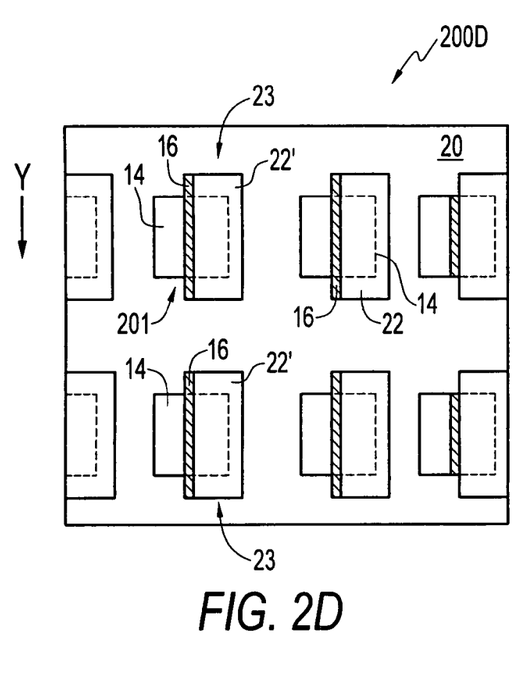

FIG. 2D illustrates a top down perspective of a memory device 200D according to another embodiment. The memory device 200D of FIG. 2D is similar to that shown in FIGS. 2A-2B, except that instead of second electrode 22 lines, the second electrodes 22', third dielectric layers 21 and phase change material layer 16 are configured as individual mesa structures 23. Therefore, each second electrode 22' is associated with one first electrode 14.

Figure 2E:
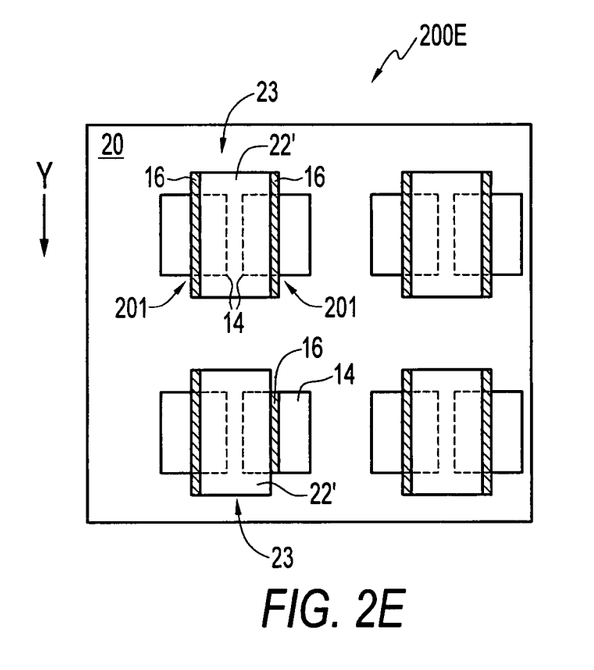

FIG. 2E illustrates a top down perspective of a memory device 200E according to another embodiment. The memory device 200E of FIG. 2E is similar to that shown in FIGS. 2C, except that instead of second electrode 22 lines, the second electrodes 22', third dielectric layers 21 and phase change material layer 16 are configured as individual mesa structures 23. Therefore, each second electrode 22' is associated with two adjacent first electrodes 14.

FIGS. 3A-3F illustrate one embodiment of a method of fabricating the phase change memory device 200A illustrated in FIGS. 2A-2B. No particular order is required for any of the actions described herein, except for those logically requiring the results of prior actions. Accordingly, while the actions below are described as being performed in a specific order, the order can be altered if desired.

Figure 3A:
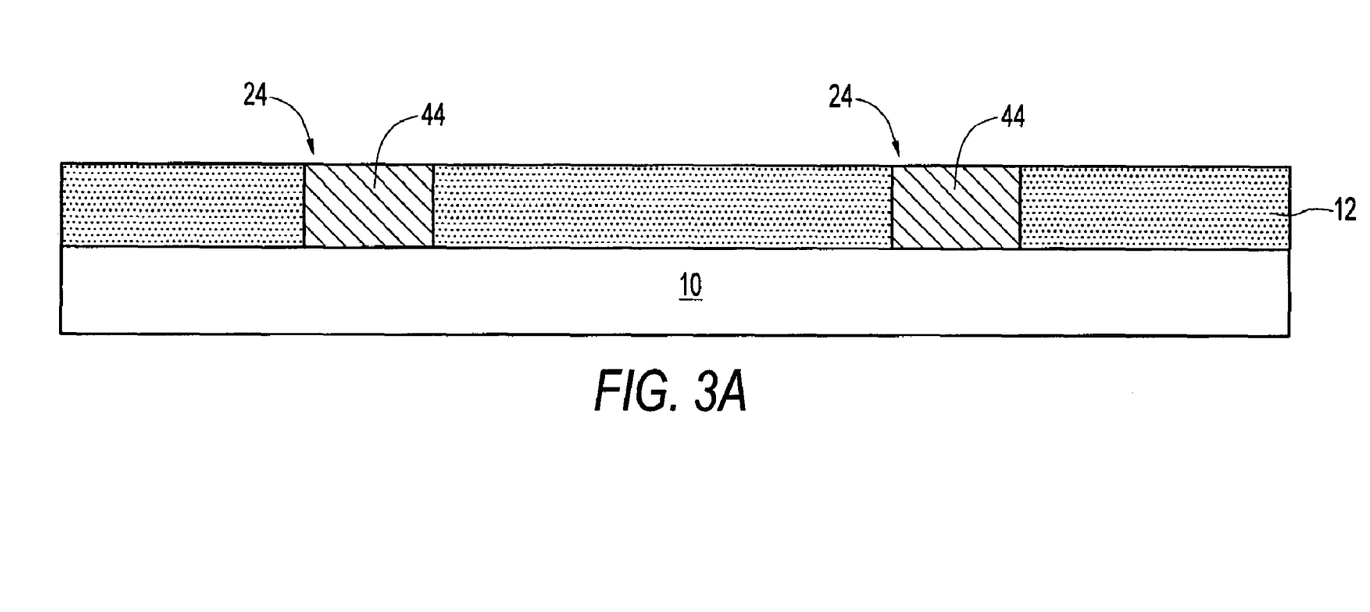
FIGS. 3A-3F illustrate partial cross-sectional views depicting a method of fabricating the phase change memory device of FIGS. 2A-2B.

As shown in FIG. 3A, a first dielectric layer 12 is formed over a substrate 10. The first dielectric layer 12 is etched to create vias 24 within which conductive plugs 44 are formed. The conductive plugs 44 are formed of any suitable conductive material, such as titanium-nitride (TiN), titanium-aluminum-nitride (TiAlN), titanium-tungsten (TiW), platinum (Pt) or tungsten (W), among others.

Figure 3B:
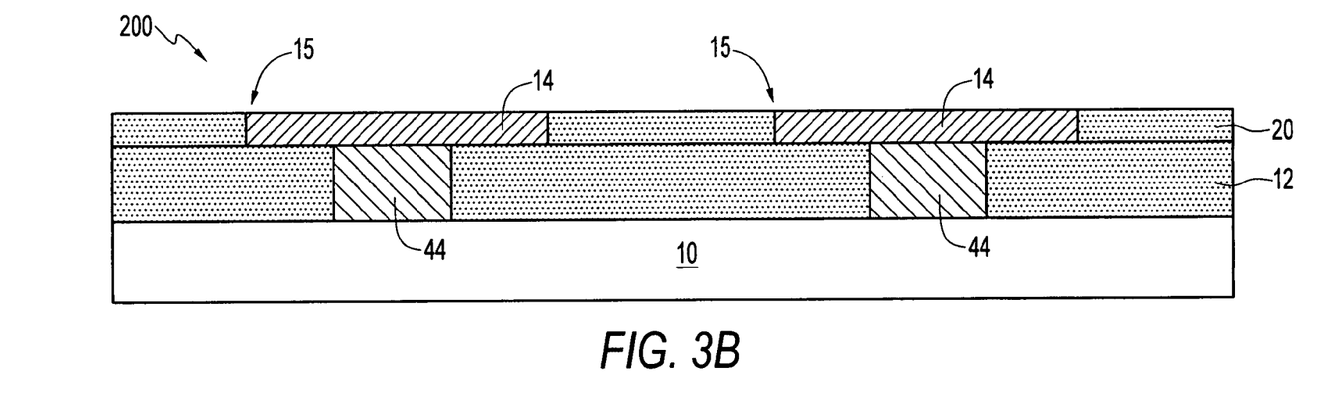

As depicted in FIG. 3B, a second insulating layer 20 is formed over the conductive plugs 44 and the first insulating layer 12. Openings 15 are formed over and aligned with each conductive plug 44 by any suitable technique. In the illustrated embodiment, the openings 15 are formed having a substantially square top down shape, however the openings 15 may have any shape e.g., circular, rectangular, etc. The first electrodes 14 are formed in openings 15 and are formed of any suitable conductive material, such as titanium-nitride (TiN), titanium-aluminum-nitride (TiAlN), titanium-tungsten (TiW), platinum (Pt) or tungsten (W), among others.

Figure 3C:
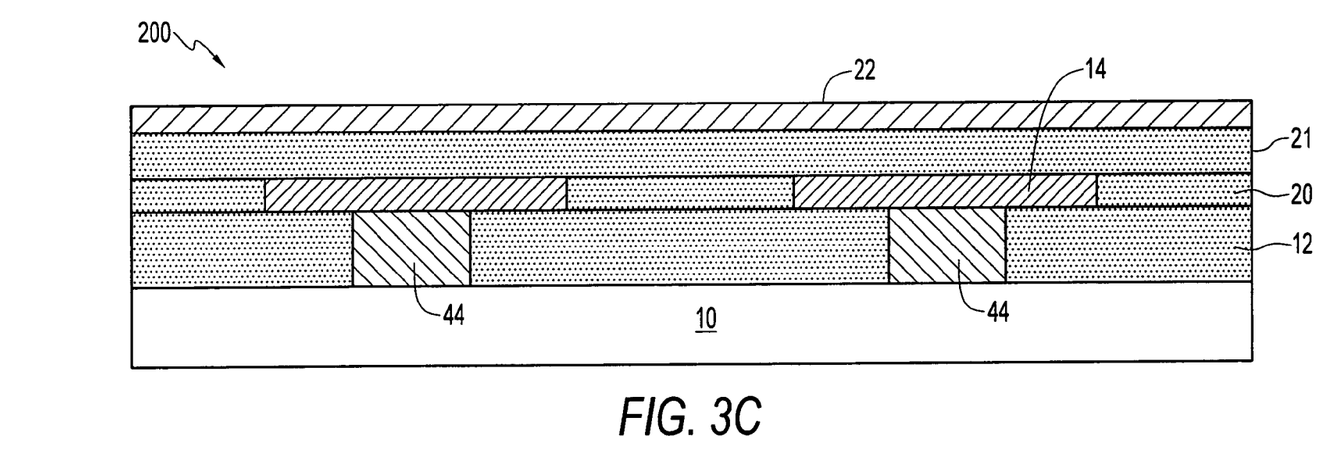

FIG. 3C illustrates the deposition of a third dielectric layer 21 and a conductive material layer for forming second electrodes 22. The second electrodes 22 are formed of any suitable conductive material and can be a same material as the conductive plugs 44 and/or the first electrodes 14. Using photolithography and trench etching, the third dielectric layer 21 and conductive material layer are patterned into lines to form third dielectric layers 21 and second electrodes 22. The etching depth is sufficient to expose an upper surface of electrodes 14. The lateral edges 223 (not shown) of the third dielectric layers 21 are formed in contact with first electrodes 14. This allows lateral edges 223 (FIG. 2B) of the second electrodes 22 to be directly over a portion of the first electrodes 14. The third dielectric layers 21 and second electrodes 22 are formed such that one lateral edge 223 of each second electrode 22 is over a portion of first electrodes 14 in a single column of first electrodes 14. The etching forms substantially straight sidewalls for the third dielectric layer 21 and the second electrode 22 lines.

Figure 3D:
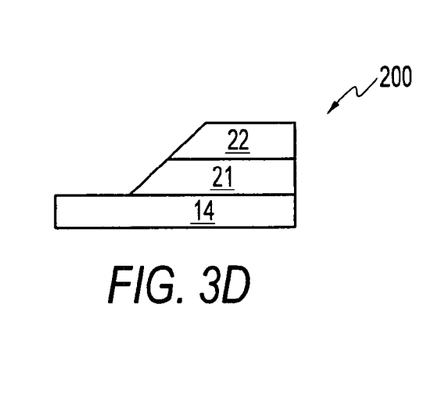

FIG. 3D is a cross-sectional view of a portion of the memory device 200 along the line 3D-3D' of FIG. 3C. As depicted in FIG. 3D, optionally, the sidewalls of the third dielectric layer 21 and second electrode 22 lines can be sloped instead of straight. The sloped sidewalls serve to promote coverage of the sidewalls with the phase change material layers 16.

Figure 3E:
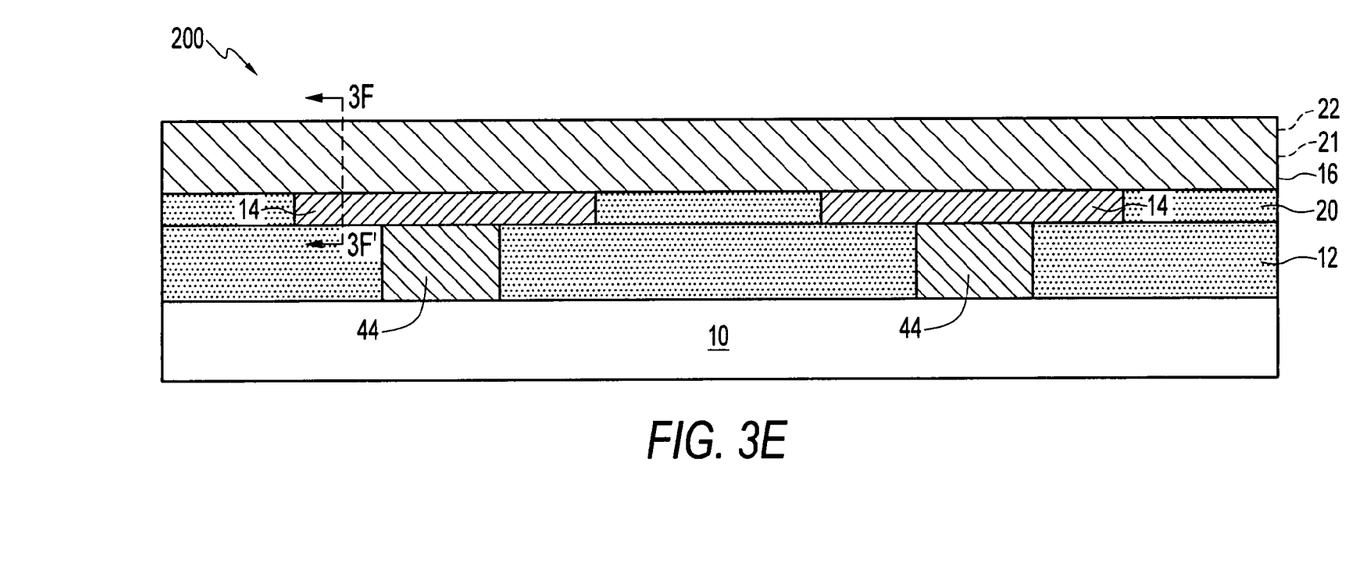

As depicted in FIG. 3E, a layer of a conformal or partially conformal phase change material 16 is formed on the sidewalls of the third dielectric layer 21 and the second electrodes 22. Preferably the phase change material layer 16 is thin and has a thickness of, for example, about 100 Å. Any suitable technique may be used to form the phase change material layer 16. For example, a conformal or partially conformal phase change material layer 16 is deposited over the second electrode 22 lines and in contact with the sidewalls of each third dielectric layer 21 and the surface of each first electrode 14. Portions of the phase change material 16 are removed to leave phase change material 16 on the sidewalls of each second electrode 22 line and each third dielectric layer 21.

In the illustrated embodiment, the deposited phase change material 16 is a chalcogenide material, such as, for example, germanium-antimony-telluride. The phase change materials can also be or include other phase change materials, for example, In—Se, Sb2Te3, GaSb, InSb, As—Te, Al—Te, GeTe, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

Figure 3F:
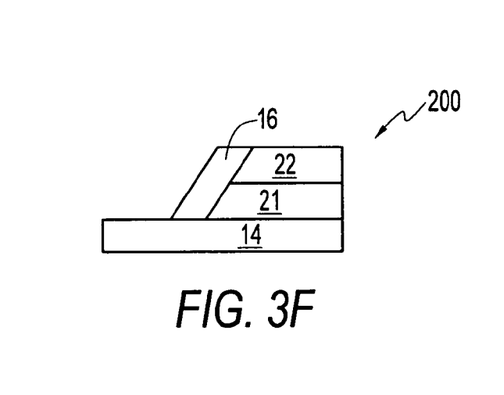

FIG. 3F is a cross sectional view of the memory device 200 of FIG. 3E along the line 3F-3F' and shows the phase change material layer 16 on the sidewalls of the second electrodes 22 and third dielectric layer 21. The programmable volume of the memory elements 201 is adjusted by adjusting the thickness of the phase change material layers 16. If desired, the phase change material layers 16 can be left along the length of the sidewalls of each second electrode 22.

Alternatively, portions of the phase change material layers 16 can be removed to achieve the structure shown in FIGS. 2A-2B. For this, a photoresist (not shown) is formed to protect the portions of the phase change material layers 16 in contact with the first electrodes 14. A wet etch or isotropic phase change material dry etch is performed to remove the unprotected portions of the phase change material layers 16 to achieve the structure shown in FIGS. 2A-2B. A fourth dielectric layer (not shown) is formed over the phase change material layers 16 to isolate the individual phase change material layers 16 from one another. By isolating the phase change material layers 16 associated with each first electrode 14, cross talk between memory elements 201 is reduced. If desired, to form the memory device 200D (FIG. 2D), portions of the phase change material layers 16, third dielectric layer 21 and second electrodes 22 can be removed to form individual mesa structures 23 shown in FIG. 2D.

After the phase change material layer 16 is formed on the sidewalls of dielectric layer 21 and second electrodes 22, the remaining trench is filled with a dielectric material by subsequent processing steps. Additional processing steps are also conducted to form additional dielectric layers, contacts and metal lines. For example, contacts to first and second electrodes 14, 22 and metal lines are formed.

The memory device 200C is formed in a similar manner as described above in connection with FIGS. 3A-3F. To form the memory device 200C, however, the third dielectric layer 21 and conductive material layer are patterned using photolithographic and etching techniques into lines to form third dielectric layers 21 and second electrodes 22 such that each lateral edge 223 of each second electrode 22 is over a portion of first electrodes in a single column of first electrodes 14. Therefore, each second electrode 22 is associated with first electrodes 14 in two adjacent columns, as shown in FIG. 2C. Other than this, processing proceeds as described in connection with FIGS. 3A-3F. The memory device 200E (FIG. 2E) is formed similarly to the memory device 200C, except that portions of the phase change material layers 16, third dielectric layer 21 and second electrodes 22 are removed to form individual mesa structures 23 shown in FIG. 2E.

Figure 4:
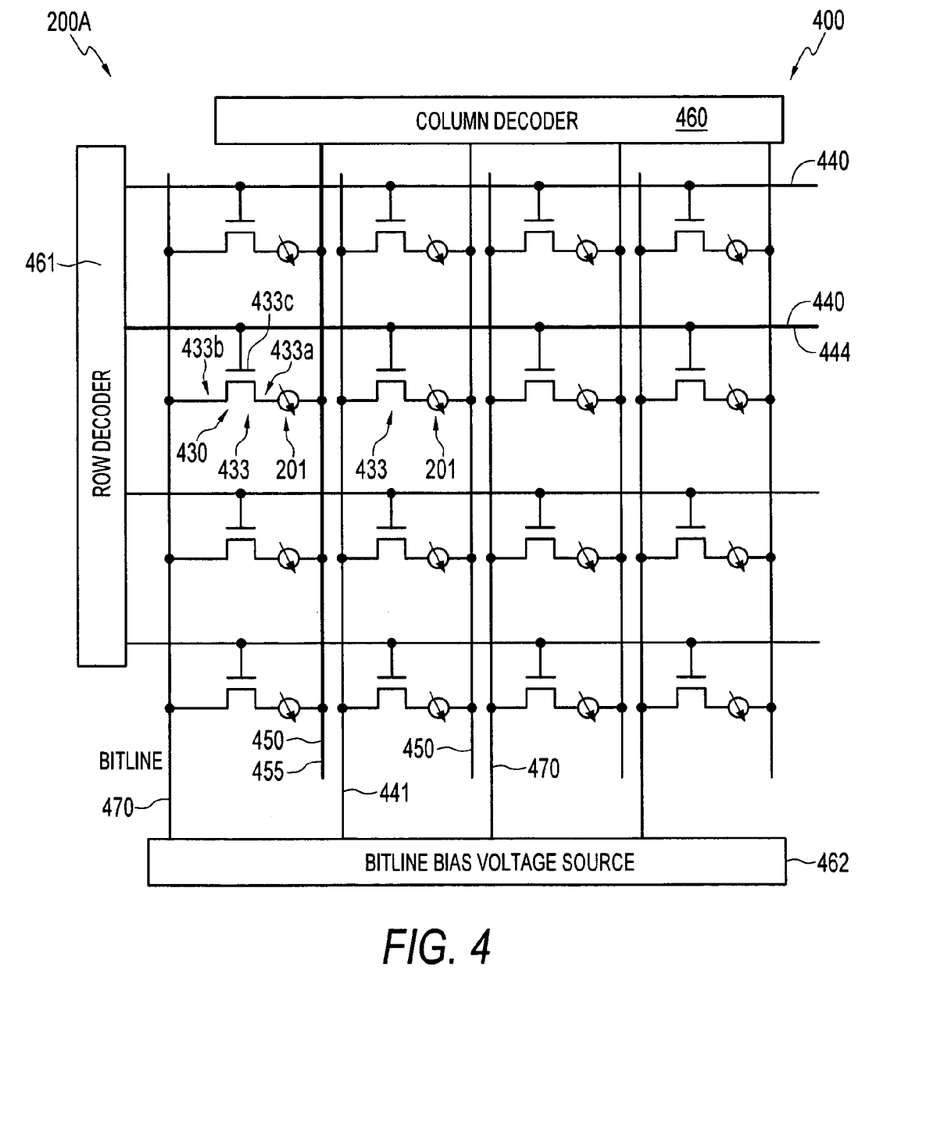
FIG. 4 is a schematic diagram of a phase change memory device circuit for the memory device of FIGS. 2A-2B.

FIG. 4 is a schematic diagram of a memory device circuit 400 for the memory device 200A of FIGS. 2A-2B. The memory elements 201 are arranged in columns and rows. Each memory element 201 is connected to a select line 450 for a respective column. Specifically, each select line 450 is connected to a second electrode 22 of a respective memory element 201 or is the second electrode line 22 for the memory elements 201 of a respective column. Each select line 450 is connected to column decoder circuitry 460.

Each memory element 201 is further switchably connected to a bit line 470. In the FIG. 4 embodiment, each memory element 201 is connected to a first source/drain region 433a of an associated access transistor 433. The second source/drain region of each access transistor 433 is connected to a respective bit line 470. Each bit line 470 is connected to a voltage source or a bit line decoder circuit 462. Each gate 433c of each access transistor 433 is connected to a word line 440 for a respective row. Each word line 440 is connected to row decoder circuitry 461.

To select a particular element 201, the corresponding select line 450 is selected by the column decoder 460 and the corresponding word line 440 is selected by the row decoder 461. For example, by selecting the specific word line 444 and select line 455, the specific memory element 430 is selected.

Figure 5:
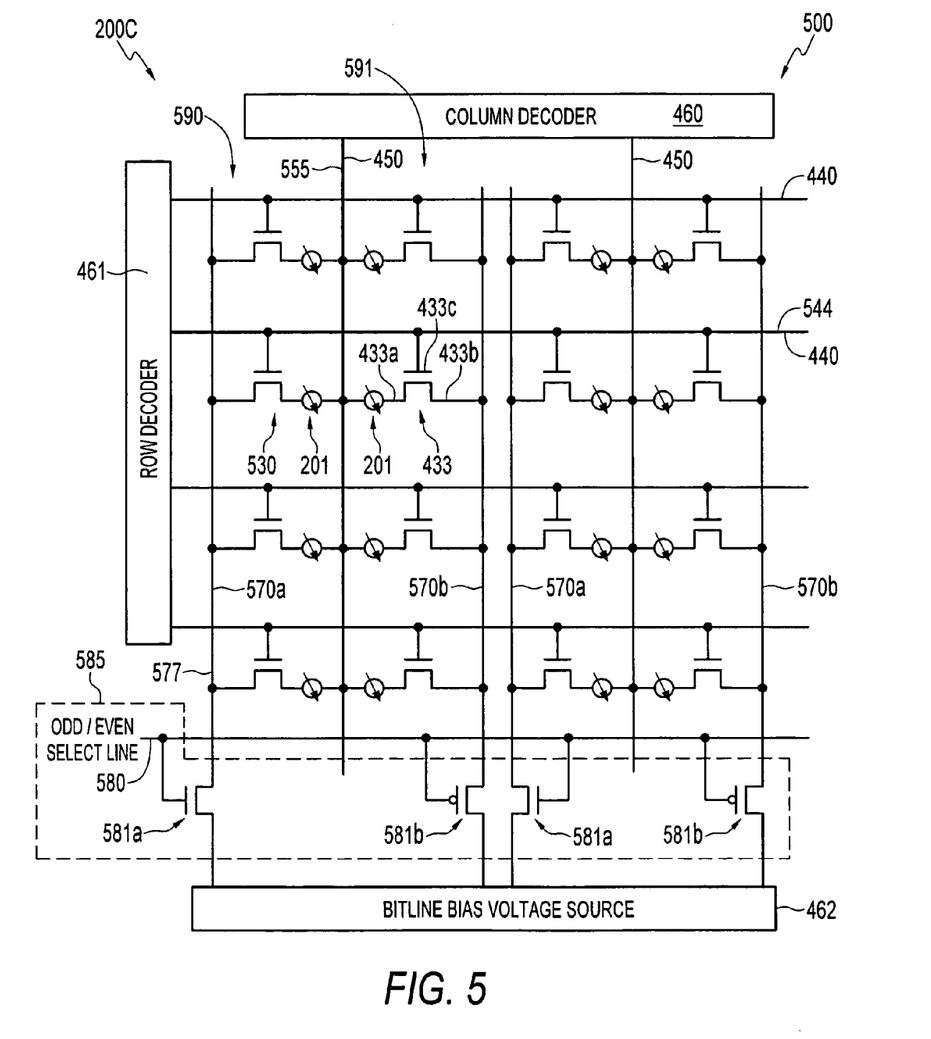
FIG. 5 is a schematic diagram of a phase change memory device circuit for the memory device of FIG. 2C.

FIG. 5 is a schematic diagram of a memory device circuit 500 for the memory device 200C of FIG. 2C. The memory device circuit 500 is similar to that shown in FIG. 4, except that one select line 450 is provided for every two columns of memory elements 201.

Further, each bit line 570a, 570b is switchably connected to a voltage source 462 or a bit line decoder circuit (not shown) by bit line select circuitry 585. In the FIG. 5 embodiment, the bit line select circuitry 585 includes several bit line select transistors 581a, 581b. The bit line select transistors 581a and 581b are shown as n-type and p-type transistors, respectively. For the two columns associated with a single select line 450, a first column 590 is associated with a bit line 570a connected to an n-type bit line select transistor 581a and the second column 591 is associated with a bit line 570b connected to a p-type bit line select transistor 581b. The bit line select circuitry 585 also includes a bit line select line 580 connected to the gate of each bit line select transistor 581a, 581b for selectively activating the bit line select transistors 581a, 581b.

As in the memory device circuit 400 (FIG. 4), to operate memory device circuit 500 to select a particular memory element 201, the corresponding select line 450 is selected by the column decoder circuitry 460 and the corresponding word line 440 is selected by the row decoder circuitry 461. Further, bit line select line 580 is driven high or low to selectively operate one type of the bit line select transistors 581a, 581b. For example, to select the specific memory element 530, the specific word line 544 and select line 555 are selected. Further, the bit line select line 580 is driven high to selectively operate the n-type bit line select transistors 581a to selectively connect the specific bit line 570a, also designated 577, to the voltage source 462.

FIGS. 4 and 5 depict only examples of memory device circuits 400, 500 including the memory devices 200A, 200C and memory elements 201 described herein. Other circuit designs incorporating the memory devices 200A, 200C and memory elements 201 are possible. Also, embodiments have been described as employing phase change material 16 as a programmable resistance material. Embodiments may also employ one or more layers of other programmable resistance materials in place of phase change material layer 16. Examples of other programmable resistance materials include such as metal doped chalcogenide glass and those programmable resistance materials discussed in various patents and patent applications assigned to Micron Technology, Inc., including, but not limited to the following: U.S. patent application Ser. No. 10/765,393; U.S. patent application Ser. No. 09/853,233; U.S. patent application Ser. No. 10/022,722;

U.S. patent application Ser. No. 10/663,741; U.S. patent application Ser. No. 09/988,984; U.S. patent application Ser. No. 10/121,790; U.S. patent application Ser. No. 09/941,544; U.S. patent application Ser. No. 10/193,529; U.S. patent application Ser. No. 10/100,450; U.S. patent application Ser. No. 10/231,779; U.S. patent application Ser. No. 10/893,299; U.S. patent application Ser. No. 10/077,872; U.S. patent application Ser. No. 10/865,903; U.S. patent application Ser. No. 10/230,327; U.S. patent application Ser. No. 09/943,190; U.S. patent application Ser. No. 10/622,482; U.S. patent application Ser. No. 10/081,594; U.S. patent application Ser. No. 10/819,315; U.S. patent application Ser. No. 11/062,436; U.S. patent application Ser. No. 10/899,010; and U.S. patent application Ser. No. 10/796,000, the disclosures of each of which are incorporated herein by reference.

Figure 6:
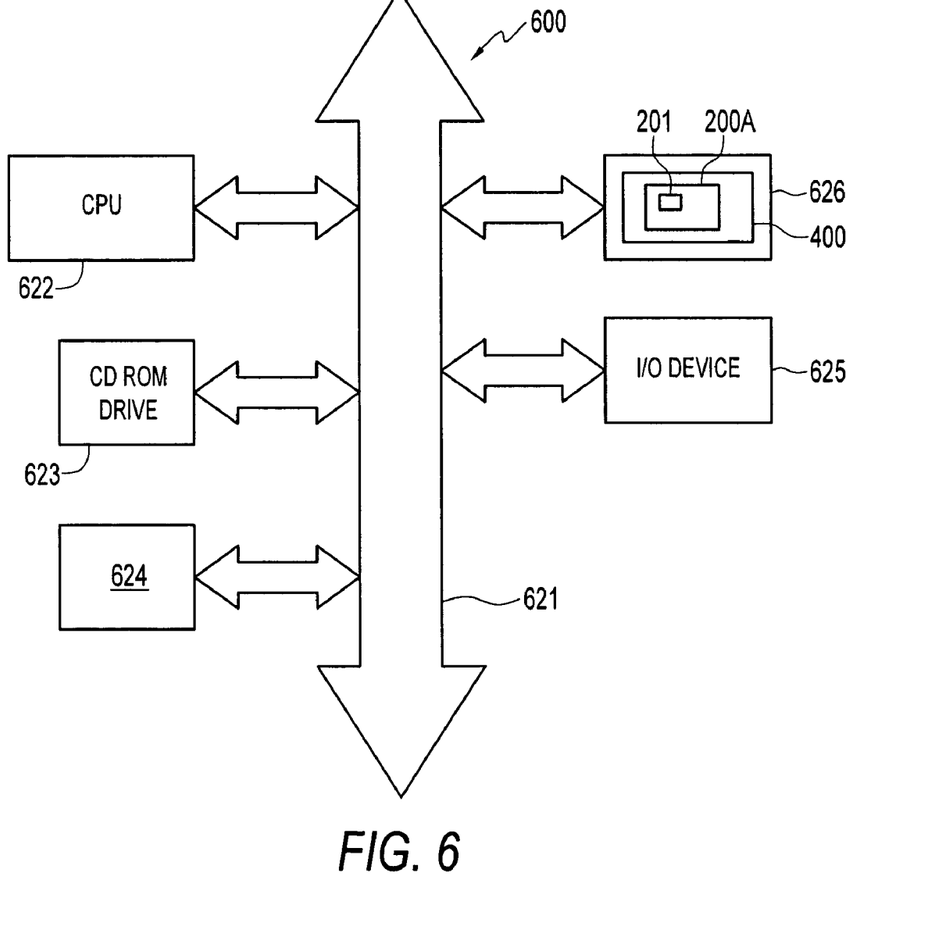
FIG. 6 is a block diagram of a processor system having a memory device incorporating a phase change memory element constructed in accordance with an embodiment of the invention.

FIG. 6 illustrates a simplified processor system 600, which includes a memory unit 626 including memory circuit 400 having a phase change memory device 200A and memory elements 201 constructed in accordance with embodiments of the invention. The system 600 could instead include memory circuit 500 having a phase change memory device 200C.

The FIG. 6 processor system 600, which can be any system including one or more processors, for example, a computer or other control system, generally comprises a central processing unit (CPU) 622, such as a microprocessor, a digital signal processor, or other programmable digital logic devices, which communicates with one or more input/output (I/O) devices 625 over a bus 621. The memory unit 626 communicates with the CPU 622 over bus 621 typically through a memory controller.

In the case of a computer system, the processor system 600 may include peripheral devices such as a compact disc (CD) ROM drive 623 and hard drive 624, which also communicate with CPU 622 over the bus 621. If desired, the memory circuit 626 may be combined with the processor, for example CPU 622, in a single integrated circuit.

The above description and drawings are only to be considered illustrative of specific embodiments, which achieve the features and advantages described herein. Modification and substitutions to specific process conditions and structures can be made. Accordingly, the embodiments of the invention are not to be considered as being limited by the foregoing description and drawings, but is only limited by the scope of the appended claims.

What is claimed as new and desired to be protected by Letters Patent of the United States is:

1. A method of forming a memory element, the method comprising:
   forming a first electrode;
   forming a stack over the first electrode, the stack having sidewalls and comprising:
      a first dielectric material, the first dielectric material having a top surface, and a second electrode in contact with the top surface of the first dielectric material, the sidewalls of the stack comprising a lateral edge of the second electrode over and in contact with a lateral edge of the first dielectric material; and
   forming a programmable resistance material in contact with the first electrode and at least a portion of a sidewall of the stack.

2. The method of claim 1, wherein the second electrode is formed as a line.

3. The method of claim 2, wherein forming the second electrode comprises forming a conductive material over the first dielectric material and etching the first dielectric material and conductive material to form the line.

4. The method of claim 3, wherein etching comprises etching the first dielectric material and conductive material such that sidewalls of the stack are sloped.

5. The method of claim 4, wherein the programmable resistance material is formed in contact with all portions of the sidewalls of the stack.

6. The method of claim 1, wherein the second electrode is formed laterally offset from the first electrode.

7. The method of claim 1, further comprising forming a second dielectric material, wherein the first electrode is formed within the second dielectric material.

8. The method of claim 7, further comprising forming a third dielectric material underlying the first electrode and second dielectric material and forming a conductive plug within the third dielectric material and in contact with the first electrode.

9. The method of claim 1, wherein the programmable resistance material is formed as a phase change material.

10. A method of forming a memory device, the method comprising:
    forming a plurality of first electrodes;
    forming a dielectric material over the plurality of first electrodes, the dielectric material having sidewalls and a top surface;
    forming a second electrode in contact with the top surface of the first dielectric layer; and
    forming a plurality of portions of a programmable resistance material, each portion of programmable resistance material in contact with one of the plurality of first electrodes, the second electrode and a sidewall of the dielectric material to form a memory element.

11. The method of claim 10, wherein each portion of programmable resistance material is formed in contact with more than one of the plurality of first electrodes to form a plurality of memory elements.

12. A method of forming a memory device, the method comprising:
    forming a plurality of first electrodes arranged in columns and rows;
    forming dielectric material over the plurality of first electrodes;
    forming a conductive material in contact with a top surface of the dielectric material;
    etching the dielectric material and conductive material to form a plurality of second electrode lines and a plurality of dielectric lines and to expose a surface of each first electrode, each second electrode line on a top surface of a respective dielectric line;
    forming programmable resistance material over the second electrode lines and in contact with the sidewalls of the dielectric lines and the surface of each first electrode; and
    removing portions of the programmable resistance material to leave programmable resistance material on a sidewall of each second electrode line and a sidewall of each dielectric lines.

13. The method of claim 12, wherein the dielectric material and conductive material are etched such that the second electrode lines and dielectric lines are directly over a portion of each first electrode in a respective column.

14. The method of claim 12, wherein the dielectric material and conductive material are etched such that a first lateral edge of each second electrode line and each dielectric line is formed directly over a portion of each first electrode in a first column and a second lateral edge of the second electrode line is formed directly over a portion of each first electrode in a second column.

15. The method of claim 12, further comprising, further etching the plurality of second electrode lines, plurality of dielectric lines and phase change material to form a plurality of mesa structures, a portion of each mesa structure overlying at least one first electrode.

16. The method of claim 10, wherein the programmable resistance material is formed in contact with a sidewall of the second electrode.

17. A method of forming a memory element, the method comprising:

forming a first electrode;

forming a dielectric material over the first electrode;

forming a conductive material in contact with a top surface of the dielectric material;

etching the dielectric material and conductive material to form a second electrode having a pattern and a portion of the dielectric material having the pattern and to expose a surface of the first electrode;

forming programmable resistance material over the second electrode and in contact with the sidewalls of the portion of dielectric material and the surface of the first electrode; and removing portions of the programmable resistance material to leave programmable resistance material on at least a sidewall of the second electrode and a sidewall of the portion of dielectric material.

18. The method of claim 17, wherein the dielectric material and conductive material are etched such that the second electrode and portion of dielectric material are directly over a portion of the first electrode.

* * * * *